United States Patent
Saito et al.

(10) Patent No.: US 7,688,177 B2
(45) Date of Patent: Mar. 30, 2010

(54) VARISTOR AND LIGHT-EMITTING APPARATUS

(75) Inventors: Yo Saito, Tokyo (JP); Hiroyuki Sato, Tokyo (JP); Hitoshi Tanaka, Tokyo (JP); Makoto Numata, Tokyo (JP)

(73) Assignee: TDK Corporation, Tokyo (JP)

( * ) Notice: Subject to any disclaimer, the term of this patent is extended or adjusted under 35 U.S.C. 154(b) by 670 days.

(21) Appl. No.: 11/702,516

(22) Filed: Feb. 6, 2007

(65) Prior Publication Data

US 2007/0188963 A1    Aug. 16, 2007

(30) Foreign Application Priority Data

Feb. 13, 2006    (JP)    .............. 2006-035468

(51) Int. Cl.
*H01C 7/10* (2006.01)

(52) U.S. Cl. ............ 338/21; 338/309; 338/328; 361/306.3; 361/309

(58) Field of Classification Search .......... 338/20, 338/21, 328, 307–309; 361/306.3, 309, 306.1
See application file for complete search history.

(56) References Cited

U.S. PATENT DOCUMENTS

| | | | | |
|---|---|---|---|---|
| 4,290,041 A | * | 9/1981 | Utsumi et al. | 338/21 |
| 5,119,062 A | * | 6/1992 | Nakamura et al. | 338/20 |
| 5,155,464 A | * | 10/1992 | Cowman et al. | 338/21 |
| 6,184,769 B1 | * | 2/2001 | Nakamura et al. | 338/21 |
| 6,385,034 B2 | * | 5/2002 | Tanaka | 361/306.3 |

FOREIGN PATENT DOCUMENTS

| | | |
|---|---|---|
| JP | A-2-135702 | 5/1990 |
| JP | A-3-239304 | 10/1991 |
| JP | A-9-260187 | 10/1997 |

(Continued)

OTHER PUBLICATIONS

"Japanese Office Action for Japanese Application No. 2006-035468," issued on Apr. 30, 2009, pp. 1-2, Japanese Patent Office, Japan.

*Primary Examiner*—Kyung Lee
(74) *Attorney, Agent, or Firm*—Oliff & Berridge, PLC

(57) ABSTRACT

A varistor comprises a varistor element body, first and second inner electrodes opposing each other, a first outer electrode connected to the first inner electrode physically and electrically, a second outer electrode connected to the second inner electrode physically and electrically, and an electrically insulating layer. The first and second inner electrodes are arranged within the varistor element body so as to have end portions exposed at two outer surfaces of the varistor element body. The first outer electrode is arranged on one of the two outer surfaces so as to cover a portion of the end portion of the first inner electrode exposed at the one outer surface. The second outer electrode is arranged on the one outer surface so as to cover a portion of the end portion of the second inner electrode exposed at the one outer surface. The electrically insulating layer is arranged on the one outer surface so as to cover a portion exposed from the first outer electrode in the end portion of the first inner electrode and a portion exposed from the second outer electrode in the end portion of the second inner electrode.

6 Claims, 12 Drawing Sheets

FOREIGN PATENT DOCUMENTS

| | | |
|---|---|---|
| JP | A-11-40449 | 2/1999 |
| JP | A-11-67583 | 3/1999 |
| JP | A 2001-15815 | 1/2001 |
| JP | A-2003-209002 | 7/2003 |
| JP | A-2003-303704 | 10/2003 |
| JP | A-2004-006519 | 1/2004 |
| JP | A-2004-336014 | 11/2004 |

\* cited by examiner

VARISTOR AND LIGHT-EMITTING APPARATUS

BACKGROUND OF THE INVENTION

1. Field of the Invention

The present invention relates to a varistor and a light-emitting apparatus equipped with the varistor.

2. Related Background Art

Known as this kind of electronic component is one comprising an electronic device and a varistor electrically connected to the electronic device (see, for example, Japanese Patent Application Laid-Open No. 2001-15815). In the light-emitting apparatus described in Japanese Patent Application Laid-Open No. 2001-15815, a varistor is connected in parallel to a semiconductor light-emitting device which is an electronic device, and protects the semiconductor light-emitting device against surges of ESD (Electrostatic Discharge).

SUMMARY OF THE INVENTION

Meanwhile, electronic devices include those which generate heat during their operations, such as semiconductor light-emitting devices and FETs (Field Effect Transistors). At a high temperature, the electronic devices may deteriorate their characteristics, thereby affecting their operations. This makes it necessary to diffuse the generated heat efficiently.

Hence, it is an object of the present invention to provide a varistor and a light-emitting apparatus which can efficiently diffuse heat.

The present invention provides a varistor comprising a varistor element body; first and second inner electrodes arranged within the varistor element body so as to oppose each other and have end portions exposed at two outer surfaces of the varistor element body; a first outer electrode arranged on one of the two outer surfaces so as to cover a portion of the end portion of the first inner electrode exposed at the one outer surface while being physically and electrically connected to the first inner electrode; a second outer electrode arranged on the one outer surface so as to cover a portion of the end portion of the second inner electrode exposed at the one outer surface while being physically and electrically connected to the second inner electrode; and an electrically insulating layer arranged on the one outer surface so as to cover a portion exposed from the first outer electrode in the end portion of the first inner electrode and a portion exposed from the second outer electrode in the end portion of the second inner electrode.

In the varistor in accordance with the present invention, end portions of each of the first and second inner electrodes are exposed at two outer surfaces of the varistor element body. The end portion of the first inner electrode exposed at one outer surface has a portion exposed from the first outer electrode, whereas the end portion of the second inner electrode exposed at the one outer surface has a portion exposed from the second outer electrode. As a consequence, the heat transmitted to the varistor can efficiently be diffused from the first and second inner electrodes. Since the portion exposed from the first electrode in the end portion of the first inner electrode and the portion exposed from the second electrode in the end portion of the second inner electrode are covered with the electrically insulating layer, short circuits are restrained from occurring in the varistor.

Preferably, a plurality of first electrodes and a plurality of second electrodes are arranged alternately within the varistor element body, the first outer electrode is arranged so as to extend over a plurality of the first inner electrodes and is connected thereto physically and electrically, and the second outer electrode is arranged so as to extend over a plurality of the second inner electrodes and is connected thereto physically and electrically.

Preferably, the varistor further comprises a third outer electrode arranged on the other of the two outer surfaces so as to cover a portion of the end portion of the first inner electrode exposed at the other outer surface while being physically and electrically connected to the first inner electrode; a fourth outer electrode arranged on the other of the two outer surfaces so as to cover a portion of the end portion of the second inner electrode exposed at the other outer surface while being physically and electrically connected to the second inner electrode; and an electrically insulating layer arranged on the other outer surface so as to cover a portion exposed from the third outer electrode in the end portion of the first inner electrode and a portion exposed from the fourth outer electrode in the end portion of the second inner electrode. In this case, other electric circuit elements, devices, and the like can easily be mounted to the varistor, and the varistor mounted with other electric circuit elements, devices, and the like can easily be mounted to a circuit board and the like. Since the portion exposed from the third electrode in the end portion of the first inner electrode and the portion exposed from the fourth electrode in the end portion of the second inner electrode are covered with the electrically insulating layer, short circuits are restrained from occurring in the varistor.

Preferably, a plurality of first electrodes and a plurality of second electrodes are arranged alternately within the varistor element body, the first and third outer electrodes are arranged so as to extend over a plurality of the first inner electrodes and are connected thereto physically and electrically, and the second and fourth outer electrodes are arranged so as to extend over a plurality of the second inner electrodes and are connected thereto physically and electrically.

Preferably, the two outer surfaces oppose each other. In this case, the varistor can be mounted more easily.

The present invention provides a light-emitting apparatus comprising a semiconductor light-emitting device and a varistor; the varistor comprising a varistor element body, first and second inner electrodes arranged within the varistor element body so as to oppose each other and have end portions exposed at two outer surfaces of the varistor element body, a first outer electrode arranged on one of the two outer surfaces so as to cover a portion of the end portion of the first inner electrode exposed at the one outer surface while being physically and electrically connected to the first inner electrode, a second outer electrode arranged on the one outer surface so as to cover a portion of the end portion of the second inner electrode exposed at the one outer surface while being physically and electrically connected to the second inner electrode, and an electrically insulating layer arranged on the one outer surface so as to cover a portion exposed from the first outer electrode in the end portion of the first inner electrode and a portion exposed from the second outer electrode in the end portion of the second inner electrode; the semiconductor light-emitting device being connected to the first and second outer electrodes physically and electrically so as to be connected in parallel to the varistor.

In the light-emitting apparatus of the present invention, the first and second outer electrodes of the varistor physically connected to the semiconductor light-emitting device are physically connected to the first and second inner electrodes, respectively, whereby the heat generated in the semiconductor light-emitting device is transmitted to the first and second inner electrodes through the first and second outer electrodes. Meanwhile, end portions of each of the first and second inner electrodes are exposed at two outer surfaces of the varistor element body. The end portion of the first inner electrode exposed at one outer surface has a portion exposed from the first outer electrode, whereas the end portion of the second inner electrode exposed at the one outer surface has a portion exposed from the second outer electrode. As a result, the heat transmitted to the varistor can efficiently be diffused from the first and second inner electrodes. Since the portion exposed from the first electrode in the end portion of the first inner electrode and the portion exposed from the second electrode in the end portion of the second inner electrode are covered with the electrically insulating layer, short circuits are restrained from occurring in the varistor.

The present invention can provide a varistor and a light-emitting apparatus which can efficiently diffuse heat.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

In the following, preferred embodiments of the present invention will be explained in detail with reference to the accompanying drawings. In the explanation, constituents identical to each other or those having the same function will be referred to with numerals identical to each other without repeating their overlapping descriptions.

Figure 1:
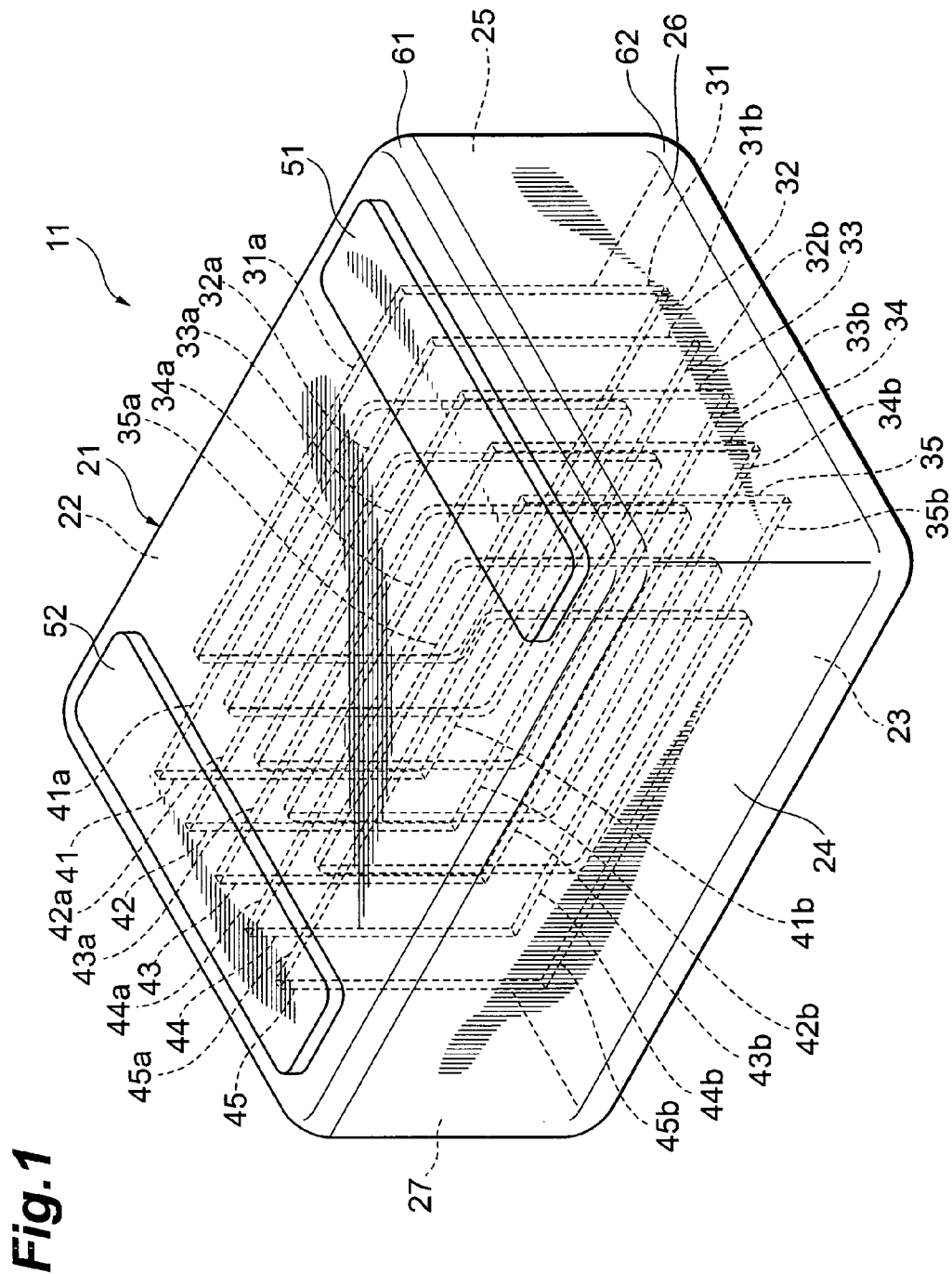
FIG. 1 is a schematic perspective view showing a varistor in accordance with an embodiment.
Figure 2:
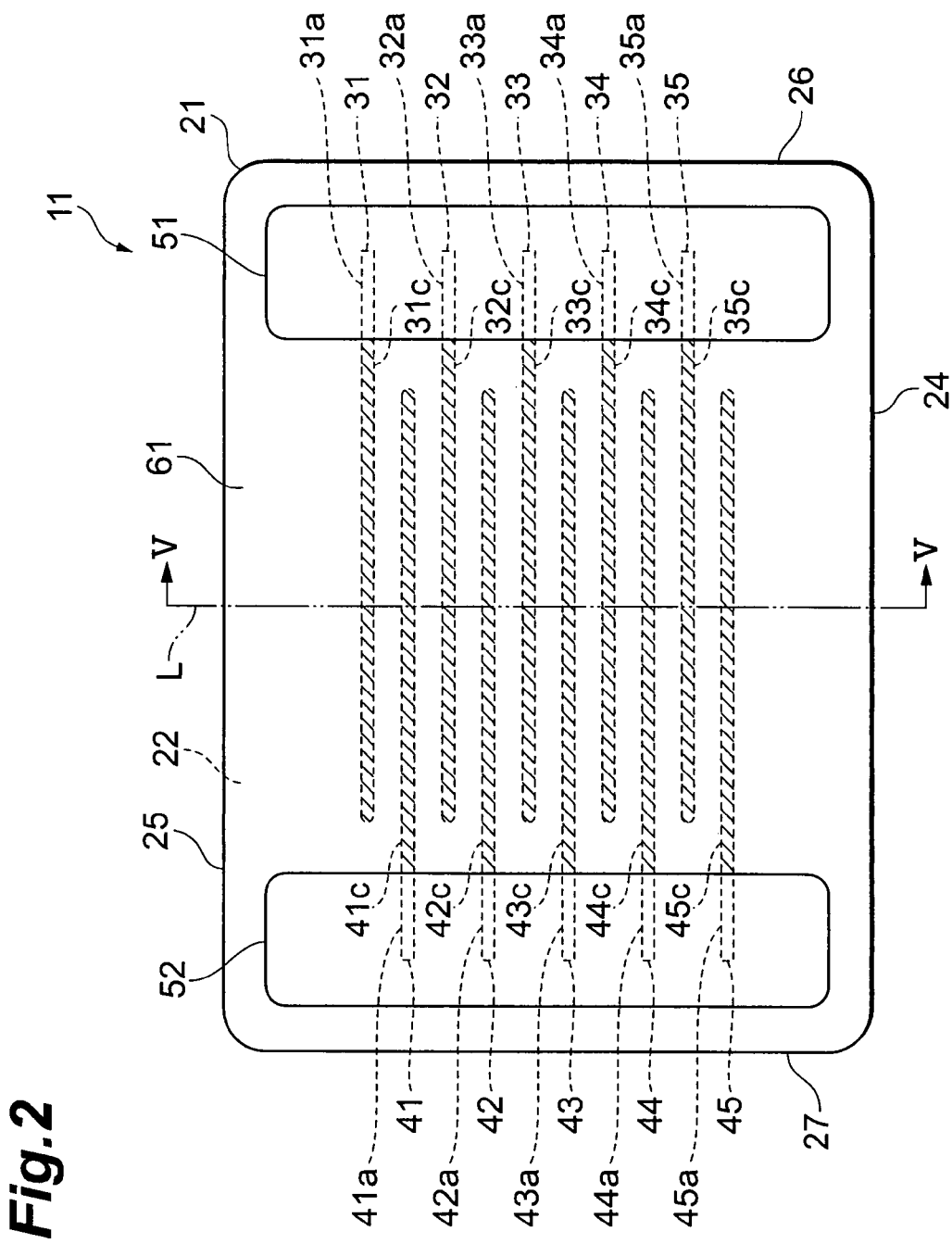
FIG. 2 is a schematic plan view showing the varistor in accordance with the embodiment.
Figure 3:
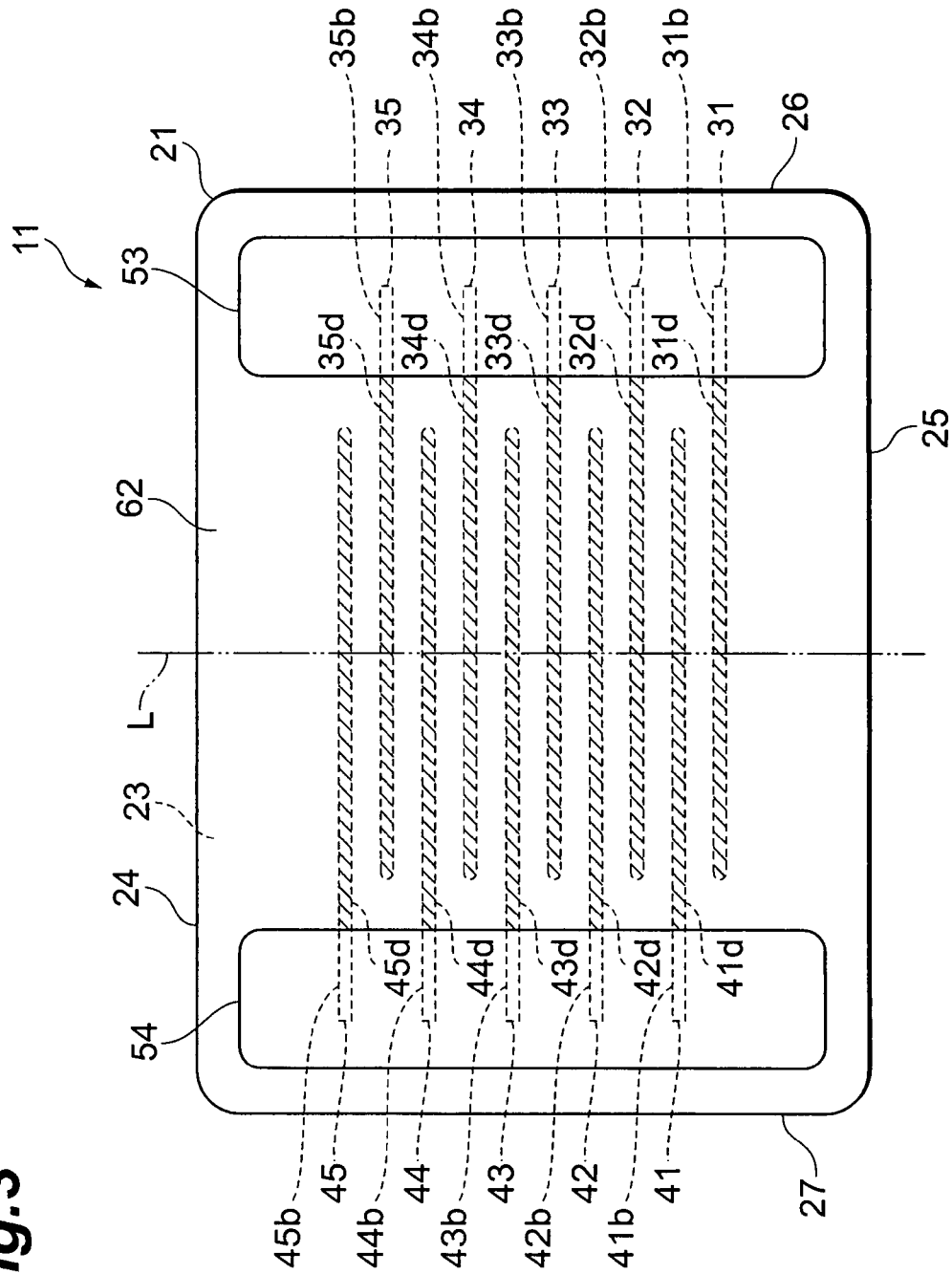
FIG. 3 is a schematic plan view showing the varistor in accordance with the embodiment.
Figure 4:
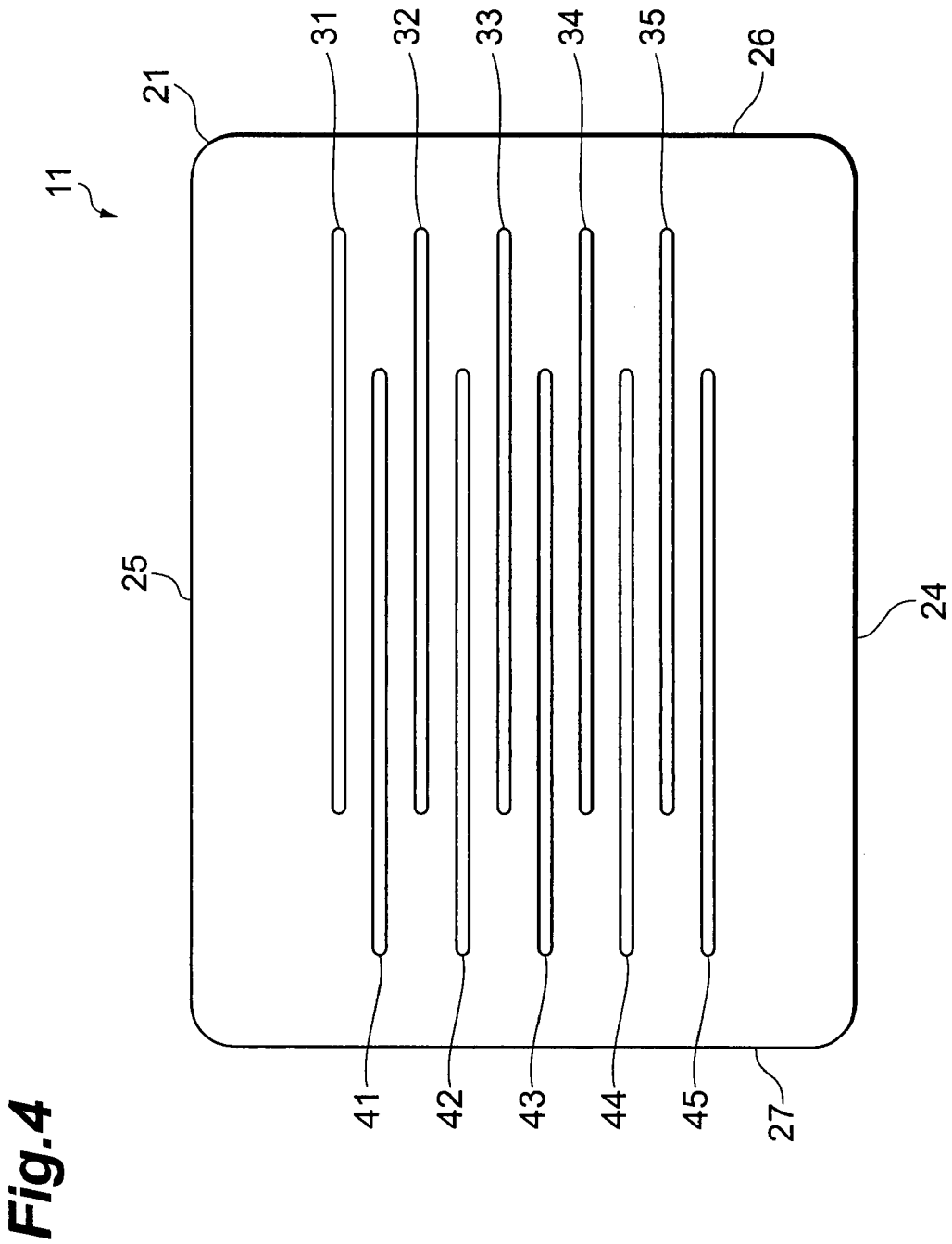
FIG. 4 is a schematic view for explaining a cross-sectional configuration of the varistor in accordance with the embodiment.
Figure 5:
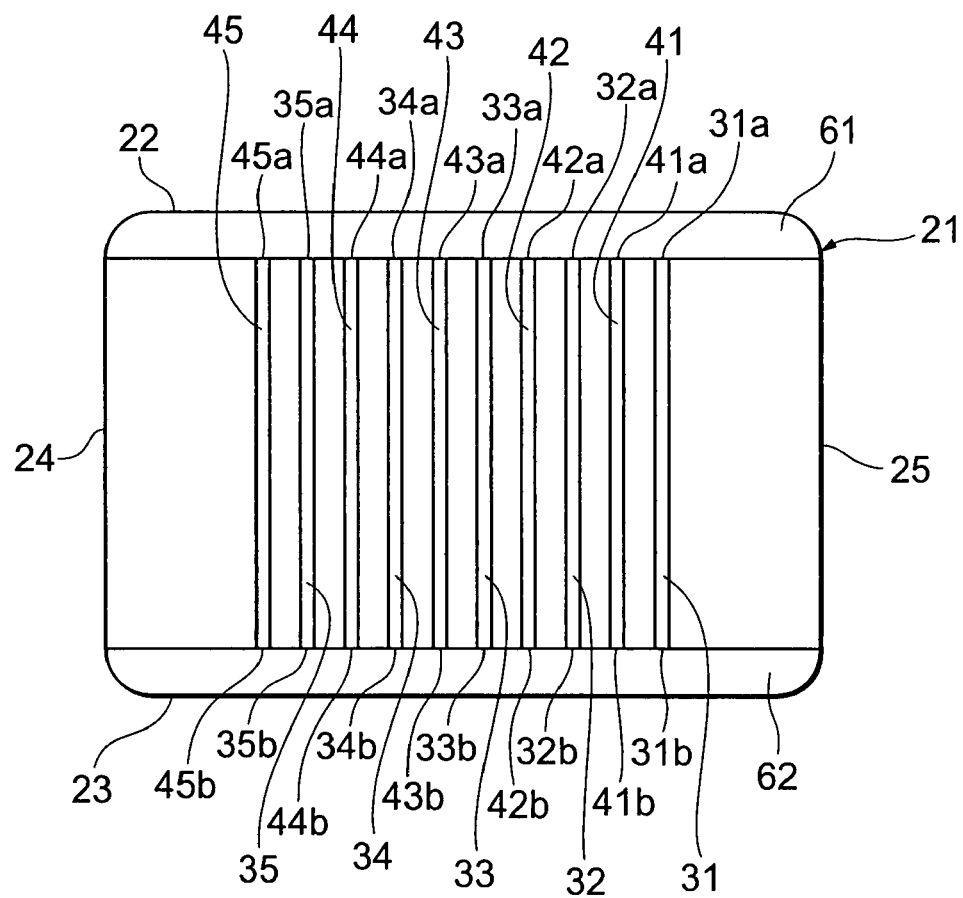
FIG. 5 is a schematic view showing a cross-sectional configuration taken along the line V-V of FIG. 2.
Figure 6:
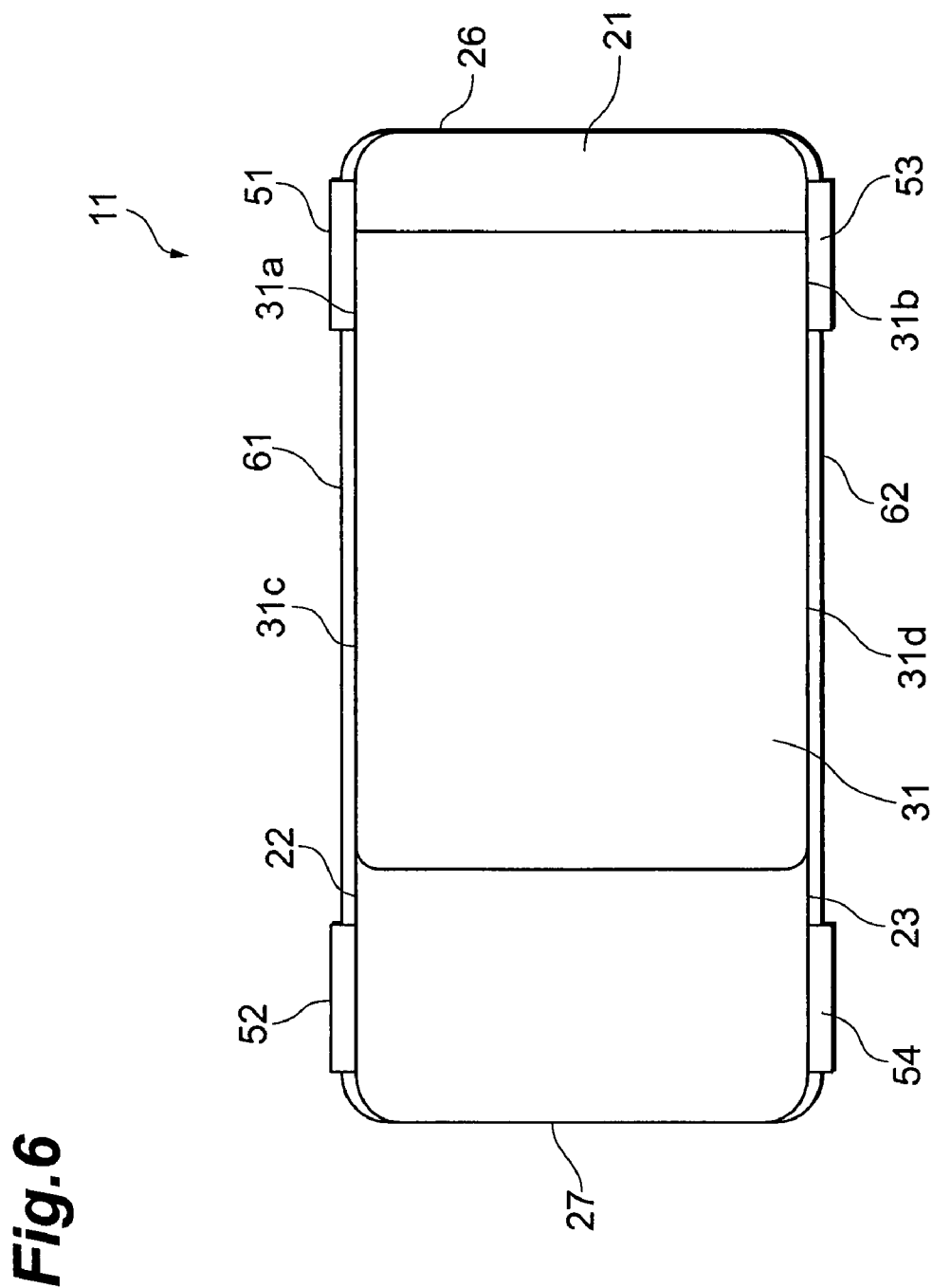
FIG. 6 is a schematic view for explaining a cross-sectional configuration of the varistor in accordance with the embodiment.
Figure 7:
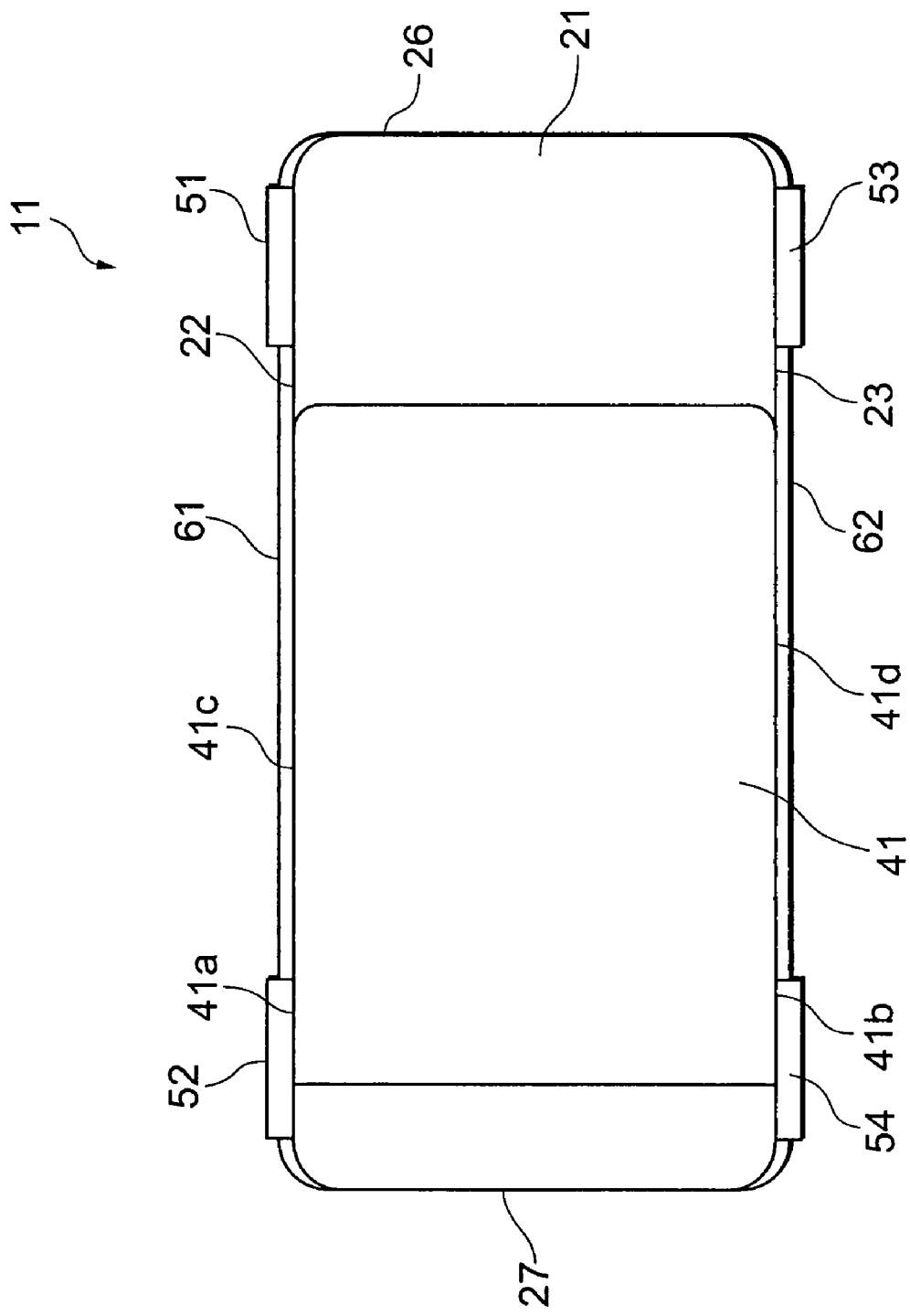
FIG. 7 is a schematic view for explaining a cross-sectional configuration of the varistor in accordance with the embodiment.

With reference to FIGS. 1 to 7, the configuration of a varistor 11 in accordance with an embodiment will be explained. FIG. 1 is a schematic perspective view showing the varistor in accordance with this embodiment. FIGS. 2 and 3 are schematic plan views showing the varistor in accordance with the embodiment. FIG. 4 is a schematic view for explaining a cross-sectional configuration of the varistor in accordance with the embodiment. FIG. 5 is a schematic view showing a cross-sectional configuration taken along the line V-V of FIG. 2. FIGS. 6 and 7 are schematic views for explaining cross-sectional configurations of the varistor in accordance with the embodiment.

As shown in FIGS. 1 to 3, the varistor 11 comprises a varistor element body 21 having a substantially rectangular parallelepiped form; a plurality of (5 in this embodiment) first inner electrodes 31 to 35; a plurality of (5 in this embodiment) second inner electrodes 41 to 45; first to fourth outer electrodes 51 to 54; and electric insulating layers 61, 62.

The length, width, and thickness of the varistor element body 21 are set to about 1.0 mm, about 0.5 mm, and about 0.3 mm, respectively, for example. As outer surfaces, the varistor element body 21 has main faces 22 and 23 opposing each other, side faces 24 and 25 opposing each other while being perpendicular to the main faces 22 and 23, and end faces 26 and 27 opposing each other while being perpendicular to the main faces 22, 23 and side faces 24, 25.

The varistor element body 21 is made of a material exhibiting nonlinear current-voltage characteristics (hereinafter referred to as "varistor characteristics"). For example, the varistor element body 21 contains ZnO as a principal component and further contains simple substances of metals such as rare-earth metal elements, Co, IIIb-family elements (B, Al, Ga, In), Si, Cr, Mo, alkali metal elements (K, Rb, Cs), and alkaline-earth metal elements (Mg, Ca, Sr, Ba), and their oxides as accessory components. The varistor element body 21 can be constructed by laminating a plurality of varistor layers exhibiting varistor characteristics.

The first inner electrodes 31 to 35 and second inner electrodes 41 to 45 are arranged alternately within the varistor element body 21 as also shown in FIGS. 4 and 5. Each of the first inner electrodes 31 to 35 and second inner electrodes 41 to 45 has an oblong form when seen in the thickness direction. FIG. 4 shows a cross-sectional configuration of the varistor 11 cut by a plane parallel to the main faces 22, 23. FIG. 6 shows a cross-sectional configuration of the varistor 11 cut by a plane including the first inner electrode 31. FIG. 7 shows a cross-sectional configuration of the varistor 11 cut by a plane including the second inner electrode 41.

The first inner electrode 31 and second inner electrode 41 hold a portion of the varistor element body 21 therebetween and are arranged parallel to the side face 24 of the varistor element body 21. The second inner electrode 41 and first inner electrode 32 hold a portion of the varistor element body 21 therebetween and are arranged parallel to the side face 24 of the varistor element body 21. Similarly, the first inner electrodes 32 to 35 and second inner electrodes 42 to 45 hold portions of the varistor element body 21 therebetween and are arranged parallel to the side face 24 of the varistor element body 21.

The first inner electrodes 31 to 35 are arranged so as to be totally overlaid on each other when seen in a direction perpendicular to the side face 24. The second inner electrodes 41 to 45 are arranged so as to be totally overlaid on each other when seen in a direction perpendicular to the side face 24. The first inner electrodes 31 to 35 and second inner electrodes 41 to 45 are shifted from each other in a direction along which a pair of end faces 26, 27 oppose each other, such as to partly overlap with each other when seen in a direction perpendicular to the side face 24.

In this embodiment, the first inner electrodes 31 to 35 are shifted toward the end face 26, whereas the second inner electrodes 41 to 45 are shifted toward the end face 27. The end portions of the first inner electrodes 31 to 35 on the end face 27 side extend to the end face 27 side of the center of the varistor element body 21. The end portions of the second inner electrodes 41 to 45 on the end face 26 side extend to the end face 26 side of the center of the varistor element body 21.

End portions 31a to 35a of the first inner electrodes 31 to 35 and end portions 41a to 45a of the second inner electrodes 41 to 45 are exposed at the main face 22. End portions 31b to 35b of the first inner electrodes 31 to 35 and end portions 41b to 45b of the second inner electrodes 41 to 45 are exposed at the main face 23. The end portions 31a to 35a, 31b to 35b of the first inner electrodes 31 to 35 are positioned closer to the end face 26 and extend to the end face 27 side of a center plane L. The center plane L is a plane equally distanced from the end faces 26 and 27. The end portions 41a to 45a, 41b to 45b of the second inner electrodes 41 to 45 are positioned closer to the end face 27 and extend to the end face 26 side of the center plane L. Namely, the first inner electrodes 31 to 35 and second inner electrodes 41 to 45 are arranged within the varistor element body 21 so as to oppose each other while having the end portions 31a to 35a, 31b to 35b, 41a to 45a, 41b to 45b exposed at their corresponding main faces 22, 23.

The first inner electrodes 31 to 35 and second inner electrodes 41 to 45 contain an electroconductive material. For example, metals such as Ag—Pd alloys are used as the electroconductive material contained in the first inner electrodes 31 to 35 and second inner electrodes 41 to 45. The coefficient of thermal conductivity of a metal is several times to several ten times that of ZnO which is a main ingredient of the varistor element body 21. For example, the coefficient of thermal conductivity of Ag is about 10 times that of ZnO. Namely, the coefficient of thermal conductivity of the first inner electrodes 31 to 35 and second inner electrodes 41 to 45 is higher than that of the varistor element body 21.

As shown in FIG. 2, the first outer electrode 51 and second outer electrode 52 are arranged on the main face 22 of the varistor element body 21, and each have an oblong form when seen in a direction perpendicular to the main face 22. The first outer electrode 51 is formed such that its longitudinal direction is a direction along which the side faces 24, 25 oppose each other. The first outer electrode 51 is positioned in a region between the ends of the second inner electrodes 41 to 45 on the end face 26 side and the end face 26 when seen in a direction perpendicular to the main face 22. The second electrode 52 is formed such that its longitudinal direction is a direction along which the side faces 24, 25 oppose each other. The second outer electrode 52 is positioned in a region between the ends of the first inner electrodes 31 to 35 on the end face 27 side and the end face 27 when seen in a direction perpendicular to the main face 22.

The first outer electrode 51 is formed so as to cover portions of the end portions 31a to 35a of the first inner electrodes 31 to 35 in the proximity of the end face 26. Namely, the first outer electrode 51 is arranged so as to extend over the first inner electrodes 31 to 35 and connected thereto electrically and physically. The first outer electrode 51 is electrically insulated from the second inner electrodes 41 to 45 without being connected thereto.

The second outer electrode 52 is formed so as to cover portions of the end portions 41a to 45a of the second inner electrodes 41 to 45 in the proximity of the end face 27. Namely, the second outer electrode 52 is arranged so as to extend over the second inner electrodes 41 to 45 and connected thereto electrically and physically. The second outer electrode 52 is electrically insulated from the first inner electrodes 31 to 35 without being connected thereto.

As shown in FIG. 3, the third outer electrode 53 and fourth outer electrode 54 are arranged on the main face 23 of the varistor element body 21, and each have an oblong form when seen in a direction perpendicular to the main face 23. The third outer electrode 53 is formed such that its longitudinal direction is a direction along which the side faces 24, 25 oppose each other. The third outer electrode 53 is positioned in a region between the ends of the second inner electrodes 41 to 45 on the end face 26 side and the end face 26 when seen in a direction perpendicular to the main face 23. The fourth electrode 54 is formed such that its longitudinal direction is a direction along which the side faces 24, 25 oppose each other. The fourth outer electrode 54 is positioned in a region between the ends of the first inner electrodes 31 to 35 on the end face 27 side and the end face 27 when seen in a direction perpendicular to the main face 23.

The third outer electrode 53 is formed so as to cover portions of the end portions 31b to 35b of the first inner electrodes 31 to 35 in the proximity of the end face 26. Namely, the third outer electrode 53 is arranged so as to extend over the first inner electrodes 31 to 35 and connected thereto electrically and physically. The third outer electrode 53 is electrically insulated from the second inner electrodes 41 to 45 without being connected thereto.

The fourth outer electrode 54 is formed so as to cover portions of the end portions 41b to 45b of the second inner electrodes 41 to 45 in the proximity of the end face 27. Namely, the fourth outer electrode 54 is arranged so as to extend over the second inner electrodes 41 to 45 and connected thereto electrically and physically. The fourth outer electrode 54 is electrically insulated from the first inner electrodes 31 to 35 without being connected thereto.

The first to fourth outer electrodes 51 to 54 are formed by printing or plating. The first to fourth outer electrodes 51 to 54 contain Au or Pt as a principal component.

As shown in FIG. 2, the end portions 31a to 35a of the first inner electrodes 31 to 35 include portions not covered with the first outer electrode 51, i.e., portions 31c to 35c exposed from the first outer electrode 51. As shown in FIG. 3, the end portions 31b to 35b of the first inner electrodes 31 to 35 include portions not covered with the third outer electrode 53, i.e., portions 31d to 35d exposed from the third outer electrode 53. The portions 31c to 35c, 31d to 35d are hatched in FIGS. 2 and 3.

The portions 31c to 35c, 31d to 35d of the first inner electrodes 31 to 35 are exposed from the first and third outer electrodes 51, 53 and extend to the end face 27 side of the center plane L. The portions 31c to 35c, 31d to 35d of the first inner electrodes 31 to 35 are formed such that their longitudinal size is at least ⅓ of the longitudinal size (distance between the end faces 26 and 27) of the varistor element body 21.

As shown in FIG. 2, the end portions 41a to 45a of the second inner electrodes 41 to 45 include portions not covered with the second outer electrode 52, i.e., portions 41c to 45c exposed from the second outer electrode 52. As shown in FIG. 3, the end portions 41b to 45b of the second inner electrodes 41 to 45 include portions not covered with the fourth outer electrode 54, i.e., portions 41d to 45d exposed from the fourth outer electrode 54. The portions 41c to 45c, 41d to 45d are hatched in FIGS. 2 and 3.

The portions 41c to 45c, 41d to 45d of the second inner electrodes 41 to 45 are exposed from the second and fourth outer electrodes 52, 54 and extend to the end face 26 side of the center plane L. The portions 41c to 45c, 41d to 45d of the second inner electrodes 41 to 45 are formed such that their longitudinal size is at least ⅓ of the longitudinal size (distance between the end faces 26 and 27) of the varistor element body 21.

The electrically insulating layer 61 is formed so as to cover the region excluding the region formed with the first and second outer electrodes 51, 52 in the main face 22. Namely, the electric insulating layer 61 covers the portions 31c to 35c, 41c to 45c exposed from the first and second outer electrodes 51, 52 in the end portions 31a to 35a, 41a to 45a in the first and second inner electrodes 31 to 35, 41 to 45.

The electrically insulating layer 62 is formed so as to cover the region excluding the region formed with the third and fourth outer electrodes 53, 54 in the main face 23. Namely, the electric insulating layer 62 covers the portions 31d to 35d, 41d to 45d exposed from the third and fourth outer electrodes 53, 54 in the end portions 31b to 35b, 41b to 45b in the first and second inner electrodes 31 to 35, 41 to 45. The electrically insulating layers 61, 62 are formed by glazed glass made of $SiO_2$, ZnO, B, $Al_2O_3$, and the like, for example.

As mentioned above, the first inner electrode 31 and second inner electrode 41 overlap with each other through a portion of the varistor element body 21. The second inner electrode 41 and first inner electrode 32 overlap with each other through a portion of the varistor element body 21. Similarly, the first inner electrodes 32 to 35 and the second inner electrodes 42 to 45 overlap with each other through portions of the varistor element body 21. Therefore, the portions overlapping with the first inner electrodes 31 to 35 and second inner electrodes 41 to 45 in the varistor element body 21 function as a region exhibiting varistor characteristics. It is not necessary for the varistor element body 21 as a whole to be constructed by a material exhibiting varistor characteristics. It will be sufficient if at least the regions overlapping with the first inner electrodes 31 to 35 and second inner electrodes 41 to 45 are constructed by a material exhibiting varistor characteristics.

In this embodiment, the end portions 31a to 35a, 31b to 35b, 41a to 45a, 41b to 45b of the first and second inner electrodes 31 to 35, 41 to 45 are exposed at the two main faces 22, 23 of the varistor element body 21. The end portions 31a to 35a, 31b to 35b, 41a to 45a, 41b to 45b have the portions 31c to 35c, 31d to 35d, 41c to 45c, 45d to 45d exposed from the first to fourth outer electrodes 51 to 54. As a consequence, the heat transmitted to the varistor 11 can efficiently be diffused from the first and second inner electrodes 31 to 35, 41 to 45.

Since the portions 31c to 35c, 31d to 35d, 41c to 45c, 41d to 45d exposed from the first to fourth outer electrodes 51 to 54 in the end portions 31a to 35a, 31b to 35b, 41a to 45a, 41b to 45b are covered with the electrically insulating layers 61, 62, short circuits can be restrained from occurring in the varistor 11.

In this embodiment, the end portions 31a to 35a, 31b to 35b of the first inner electrodes 31 to 35 and the end portions 41a to 45a, 41b to 45b of the second inner electrodes 41 to 45 are exposed at the two main faces 22, 23 opposing each other. As a consequence, the end portions 31a to 35a, 31b to 35b of the first inner electrodes 31 to 35 and the end portions 41a to 45a, 41b to 45b of the second inner electrodes 41 to 45 are exposed by a relatively large area at the main faces 22, 23 of the varistor element body 21, whereby heat can be diffused more efficiently. This can also increase the area by which the first inner electrodes 31 to 35 and second inner electrodes 41 to 45 overlap with each other, whereby the varistor 11 can enhance its energy tolerance.

Figure 8:
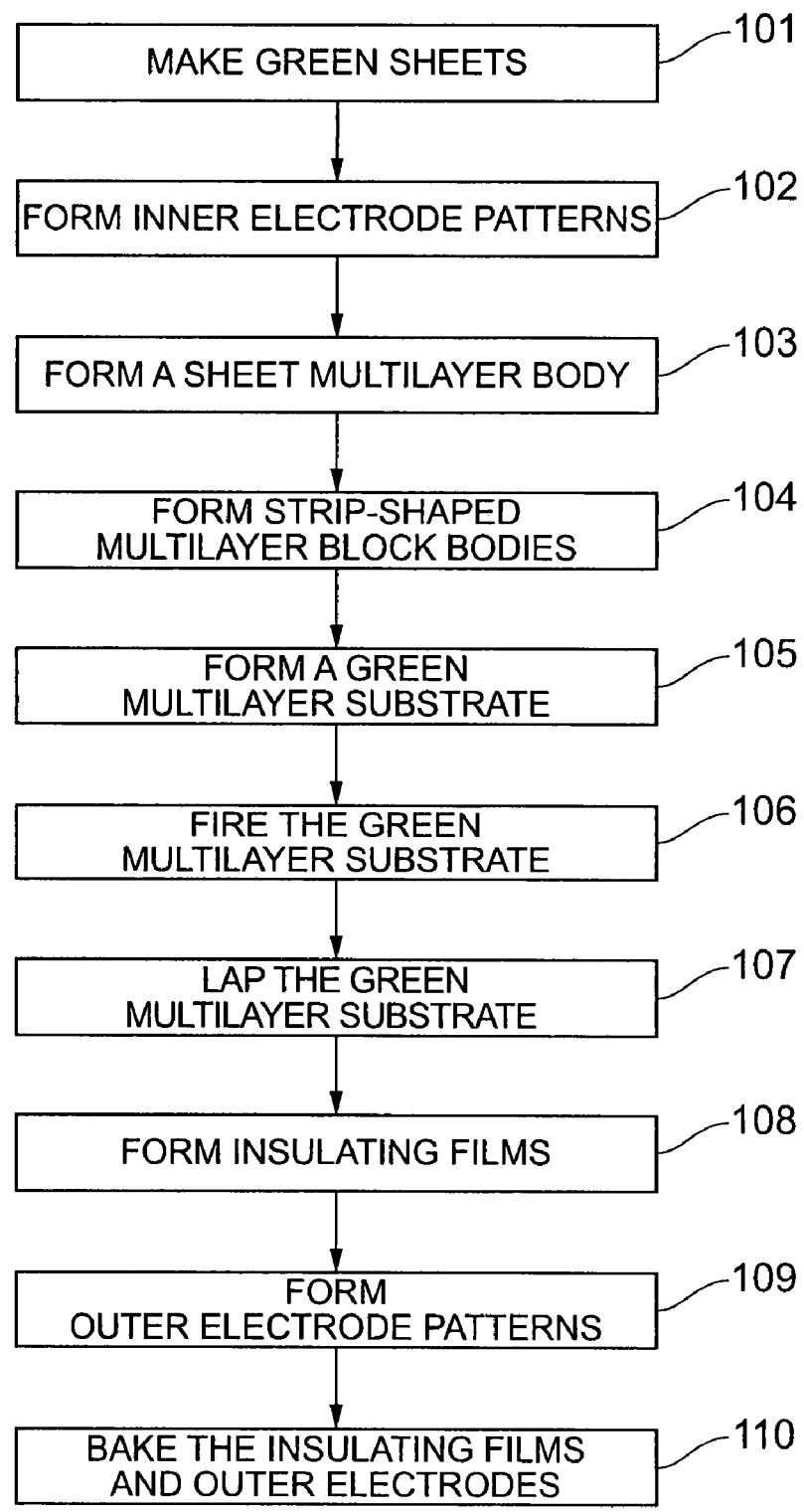
FIG. 8 is a flowchart showing a procedure of manufacturing the varistor in accordance with the embodiment.
Figure 9:
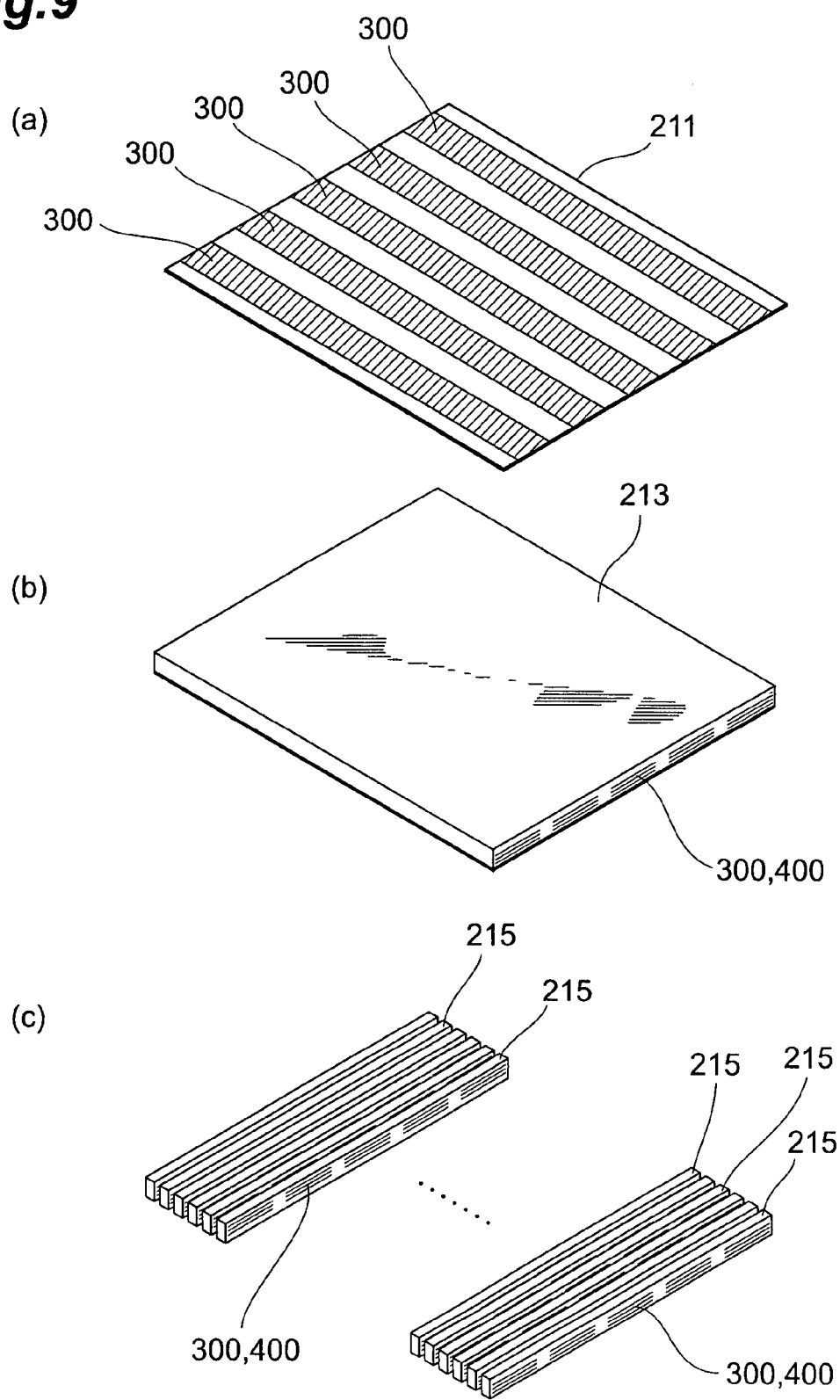
FIG. 9 is a schematic perspective view showing steps of manufacturing the varistor in accordance with the embodiment.
Figure 10:
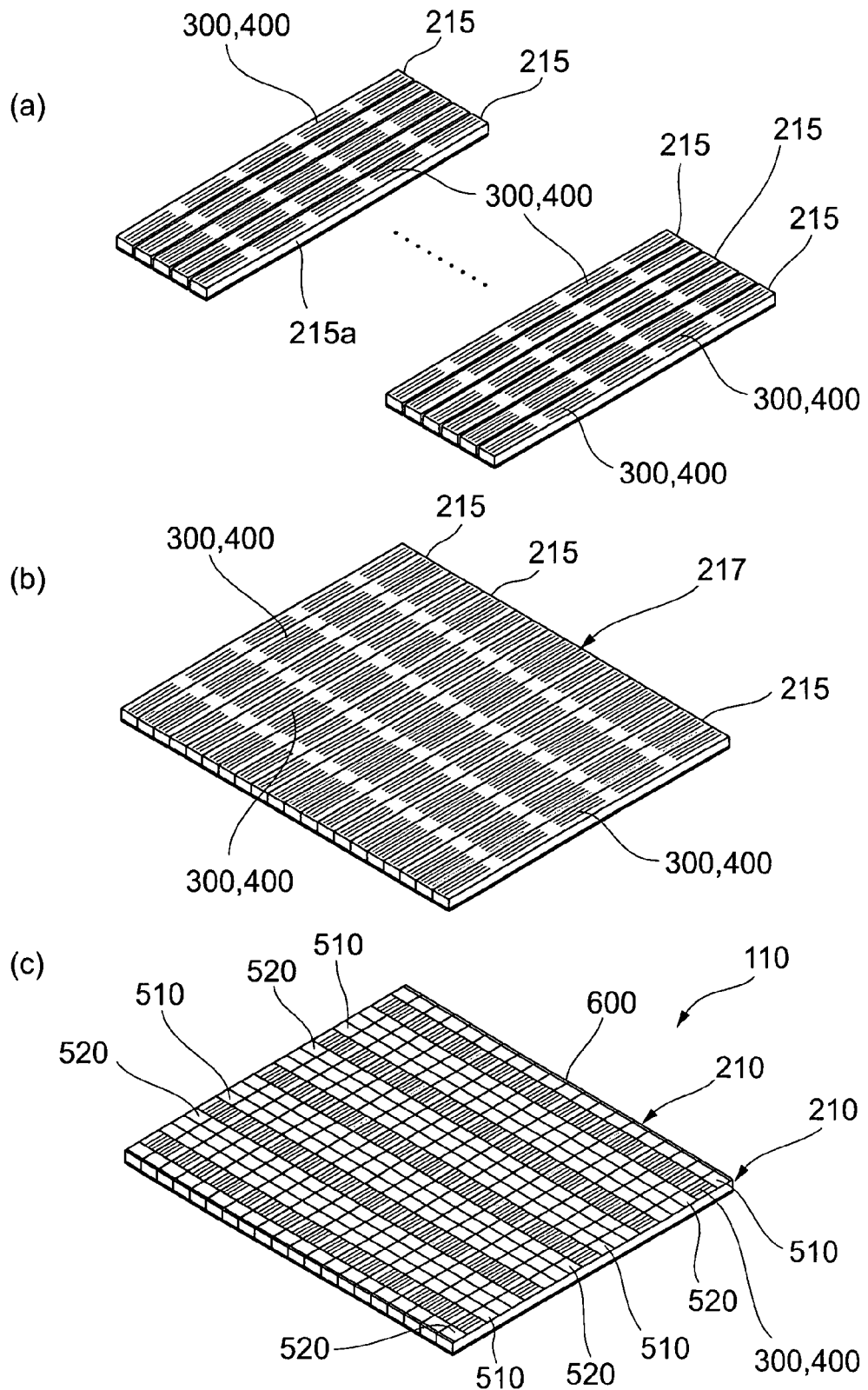
FIG. 10 is a schematic perspective view showing steps of manufacturing the varistor in accordance with the embodiment.

The varistor 11 can be manufactured according to the flowchart shown in FIG. 8. FIG. 8 is a flowchart showing a procedure of manufacturing the varistor in accordance with this embodiment. A method of manufacturing the varistor 11 will be explained with reference to FIGS. 9 and 10 together with FIG. 8. FIGS. 9 and 10 are perspective views showing steps of manufacturing the varistor in accordance with this embodiment.

First, as shown in FIG. 9(a), a predetermined number of green sheets 211 to become varistor layers constituting the varistor element body 21 are made (step 101). Specifically, ZnO which is a principal component of the varistor element body 21 and small amounts of additives such as metals or oxides which are accessory components are mixed at predetermined ratios, so as to prepare a varistor material.

An organic binder, an organic solvent, an organic plasticizer, and the like are added to the varistor material, and they are mixed/pulverized for a predetermined time by using a ball mill or the like, so as to yield a slurry. By doctor blading or the like, the slurry is applied onto a film made of polyethylene terephthalate, for example, and then is dried, so as to form a membrane having an oblong form with a thickness of about 30 μm, for example. The membrane is peeled off from the film, so as to yield a green sheet 211.

Subsequently, as shown in FIG. 9(a), inner electrode patterns 300 are formed on surfaces of a plurality of green sheets 211 (step 102). Also, inner electrode patterns 400 are formed on surfaces of a plurality of green sheets 211. Specifically, an electroconductive paste in which a metal powder mainly composed of Pd particles, an organic binder, and an organic solvent are mixed together is printed onto the surfaces of green sheets by screen printing or the like and dried, so as to form the inner electrode patterns 300, 400.

The inner electrode patterns 300, 400 are formed in a plurality of (5 in this embodiment) lines each extending from one of opposing end faces of each green sheet 211 to the other. The width of each line of the inner electrode patterns 300, 400 corresponds to the length of the first and second inner electrodes 31 to 35, 41 to 45 in a direction perpendicular to the end face 26 of the varistor element body 21. The inner electrode patterns 300, 400 are formed such that their respective positions with respect to the green sheets 211 are shifted from each other by a predetermined size in a direction perpendicular to the longitudinal direction of the lines. The inner electrode patterns 300 correspond to the first inner electrodes 31 to 35, whereas the inner electrode patterns 400 correspond to the second inner electrodes 41 to 45.

Subsequently, a sheet multilayer body 213 shown in FIG. 9(b) is formed (step 103). The green sheets 211 printed with the inner electrode patterns 300, green sheets 211 printed with the inner electrode patterns 400, and green sheets 211 printed with no inner electrode patterns 300, 400 are laminated in a predetermined order, so as to form the sheet multilayer body 213. In this sheet multilayer body 213, the inner electrode patterns 300, 400 are laminated in the vertical direction of the sheet multilayer body 213 and extend from one side face of the sheet multilayer body 213 to the opposite side face. The sheet multilayer body 213 has a thickness of about 1 to 3 mm, for example.

The respective inner electrode patterns 300 formed in the green sheets 211 are arranged so as to be totally overlaid on each other when seen from the upper side. The respective inner electrode patterns 400 formed in the green sheets 211 are arranged so as to be totally overlaid on each other when seen from the upper side. The inner electrode patterns 300 and 400 overlap with each other when seen from the upper side, while the inner electrode patterns 400 are shifted from the inner electrode patterns 300 by a predetermined size in a direction perpendicular to the longitudinal direction of the lines.

Subsequently, strip-shaped multilayer block bodies 215 shown in FIG. 9(c) are formed (step 104). The sheet multilayer body 213 is thinly cut into slices (each having a width of about 0.5 mm, for example) in a direction parallel to the laminating direction of the sheet multilayer body 213 and perpendicular to the longitudinal direction of the lines of the inner electrode patterns 300, 400, so as to form a plurality of strip-shaped multilayer block bodies 215. Here, the inner electrode patterns 300, 400 are cut into the individual strip-shaped multilayer block bodies 215 and are exposed at cut faces of the strip-shaped multilayer block bodies 215.

Next, a green multilayer substrate 217 is formed (step 105). First, as shown in FIG. 10(a), all the strip-shaped block bodies 215 are placed in a state rotated by 90° such that their cut faces become upper and lower faces. Namely, each strip-shaped block body 215 is laid on its side.

Subsequently, the strip-shaped block bodies 215 are aligned such that their side faces (faces perpendicular to the laminating direction) 215a abut against each other. Then, a plurality of strip-shaped block bodies 215 in the aligned state are held from the upper and lower sides and pressed sideways, so as to be integrated, whereby the green multilayer substrate 217 is formed. As shown in FIG. 10(b), the green multilayer substrate 217 in which the strip-shaped block bodies 215 are integrated by being connected together at their side faces 215a is obtained.

Thereafter, the green multilayer substrate 217 is heat-treated, so as to eliminate the binder, and then is fired, whereby an assembly substrate 210 is obtained (step 106). Then, the surface of the assembly substrate 210 is grinded with a lapping machine so as to remove its warpage (step 107).

Subsequently, an electrically insulating layer 600 is formed in the portion excluding the positions where outer electrode patterns which will be explained later are to be formed (step 108). The electrically insulating layer 600 can be formed by printing glazed glass (e.g., glass made of $SiO_2$, ZnO, B, $Al_2O_3$, or the like) and baking it at a predetermined temperature.

Next, as shown in FIG. 10(c), outer electrode patterns 510, 520 are formed (step 109). A plurality of outer electrode patterns 510, 520 are formed on the upper and lower faces of the assembly substrate 210. The outer electrode patterns 510 are formed so as to cover a portion of the inner electrode patterns 300 exposed at the upper or lower face of the assembly substrate 210 and are connected to the inner electrode patterns 300 electrically and physically. Namely, the outer electrode patterns 510 correspond to the outer electrodes 51, 53. The outer electrode patterns 520 are formed so as to cover a portion of the inner electrode patterns 400 exposed at the upper or lower face of the assembly substrate 210 and are connected to the inner electrode patterns 400 electrically and physically. Namely, the outer electrode patterns 520 correspond to the outer electrodes 52, 54.

The outer electrode patterns 510, 520 are formed by printing or plating. When printing, an electroconductive paste is prepared by mixing an organic binder and an organic solvent into a metal powder mainly composed of Au or Pt particles, and is printed onto the varistor element body 21 and baked or fired. When plating, Au or Pt is deposited by vacuum plating (vacuum vapor deposition, sputtering, ion plating, or the like), so as to form the outer electrode patterns 510, 520. Subsequently, the electrically insulating layer 600 and outer electrode patterns 510, 520 are baked (step 110), and the assembly substrate 210 is cut into individual chips, so as to yield varistors 11.

In this embodiment, the inner electrode patterns 300, 400 are formed like lines. This can prevent the forms of the first and second inner electrodes included in the individual varistors from being affected by deviations in lamination occurring if any in the longitudinal direction of the inner electrode patterns 300, 400 when laminating the green sheets 211 printed with the inner electrode patterns 300, 400.

Figure 11:
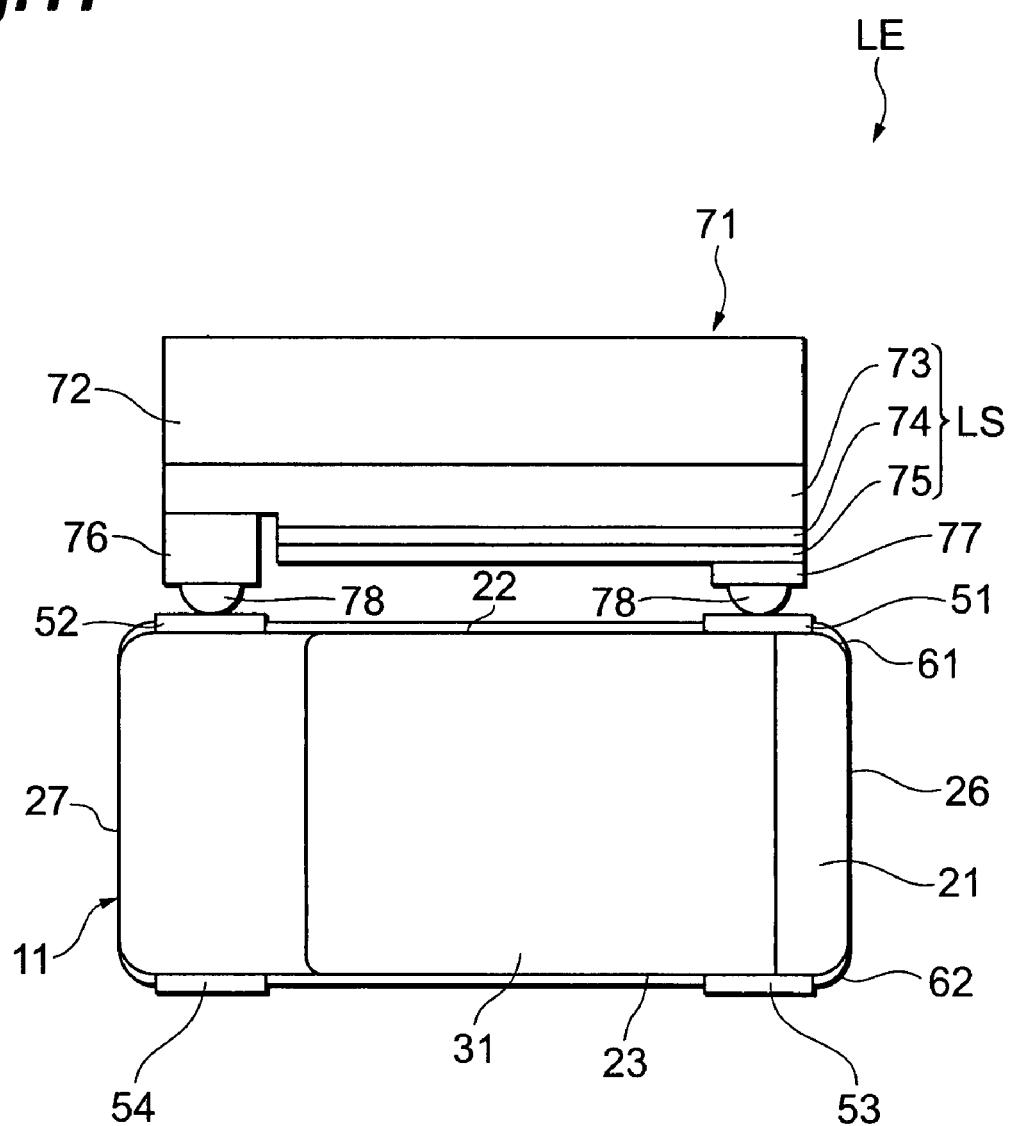
FIG. 11 is a schematic perspective view for explaining a cross-sectional configuration of a light-emitting apparatus in accordance with an embodiment.
Figure 12:
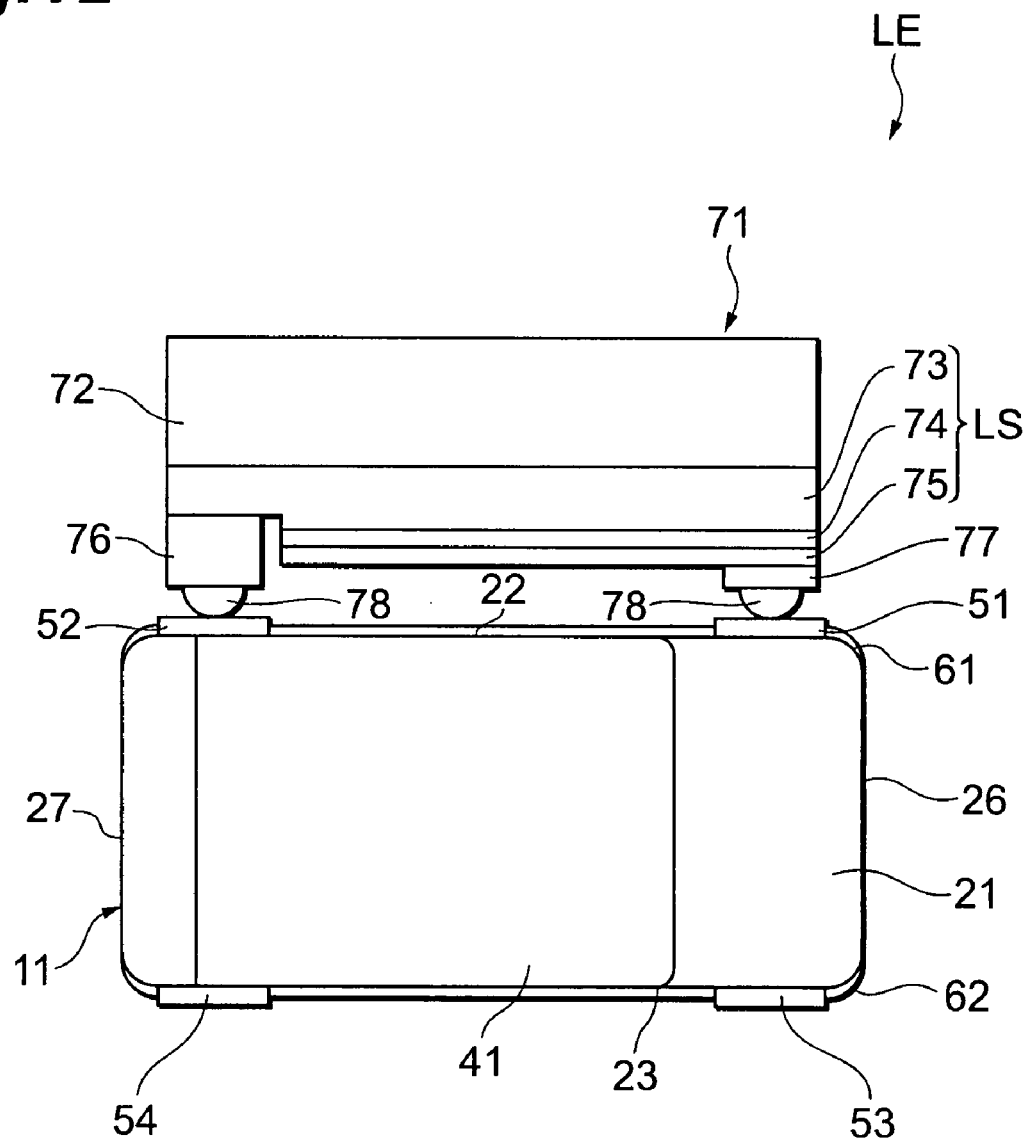
FIG. 12 is a schematic perspective view for explaining a cross-sectional configuration of the light-emitting apparatus in accordance with the embodiment.

The configuration of a light-emitting apparatus LE in accordance with an embodiment will now be explained with reference to FIGS. 11 and 12. FIGS. 11 and 12 are schematic views for explaining cross-sectional configurations of the light-emitting apparatus in accordance with this embodiment. FIG. 11 shows a cross-sectional configuration of the light-emitting apparatus LE cut along a plane including the first inner electrode 31. FIG. 12 shows a cross-sectional configuration of the light-emitting apparatus LE cut along a plane including the second inner electrode 41.

The light-emitting LE comprises a varistor 11 having the above-mentioned configuration, and a semiconductor light-emitting device 71 electrically connected to the varistor 11.

The semiconductor light-emitting device 71 is a light-emitting diode (LED) made of a semiconductor based on GaN (gallium nitride), and comprises a substrate 72 and a layer structure LS formed on the substrate 72. The GaN-based semiconductor LED has been well-known and thus will not be explained in detail. The substrate 72 is an optically transparent, electrically insulating substrate made of sapphire. The layer structure LS includes an n-type (first conduction type) semiconductor region 73, a light-emitting layer 74, and a p-type (second conduction type) semiconductor region 75 which are laminated. The semiconductor light-emitting device 71 emits light according to a voltage applied between the n-type semiconductor region 73 and p-type semiconductor region 75.

The n-type semiconductor region 73 contains an n-type nitride semiconductor. In this embodiment, the n-type semiconductor region 73 is formed by epitaxial growth of GaN on the substrate 72, and is doped with an n-type dopant such as Si, for example, so as to exhibit n-type conductivity. The n-type semiconductor region 73 may have such a composition as to exhibit a lower refractive index and a greater bandgap as compared with the light-emitting layer 74. In this case, the n-type semiconductor region 73 acts as a lower cladding for the light-emitting layer 74.

The light-emitting layer 74 is formed on the n-type semiconductor region 73, and generates light when respective carriers (electron and hole) supplied from the n-type semiconductor region 73 and p-type semiconductor region 75 are recombined. For example, the light-emitting layer 74 may have a multiple quantum well (MQW) structure in which barrier and well layers are alternately laminated over a plurality of periods. In this case, the barrier and well layers are made of InGaN, and the composition of In (indium) is appropriately selected such that the barrier layers attain a bandgap greater than that of the well layers. The light-emitting region occurs in a region where carriers are injected in the light-emitting layer 74.

The p-type semiconductor region 75 contains a p-type nitride semiconductor. In this embodiment, the p-type semiconductor region 75 is formed by epitaxial growth of AlGaN on the light-emitting layer 74, and is doped with a p-type dopant such as Mg, for example, so as to exhibit p-type conductivity. The p-type semiconductor region 75 may have such a composition as to exhibit a lower refractive index and a greater bandgap as compared with the light-emitting layer 74. In this case, the p-type semiconductor region 75 acts as an upper cladding for the light-emitting layer 74.

A cathode electrode 76 is formed on the n-type semiconductor region 73. The cathode electrode 76 is made of an electroconductive material, whereby an ohmic contact is realized between this electrode and the n-type semiconductor region 73. An anode electrode 77 is formed on the p-type semiconductor region 75. The anode electrode 77 is made of an electroconductive material, whereby an ohmic contact is realized between this electrode and the p-type semiconductor region 75. The cathode electrode 76 and anode electrode 77 are formed with bump electrodes 78.

When a predetermined voltage is applied between the anode electrode 77 (bump electrode 78) and cathode electrode 76 (bump electrode 78) to cause a current to flow in thus constructed semiconductor light-emitting device 71, light is generated in the light-emitting region of the light-emitting layer 74.

The semiconductor light-emitting device 71 is bump-connected to the first and second outer electrodes 51, 52. Namely, the cathode electrode 76 is connected to the second outer electrode 52 electrically and physically through the bump electrode 78. The anode electrode 77 is connected to the first outer electrode 51 electrically and physically through the bump electrode 78. As a consequence, varistor parts formed by regions where the first inner electrodes 31 to 35 and the second inner electrodes 41 to 45 overlap with each other are connected in parallel to the semiconductor light-emitting device 71. Therefore, the varistor 11 can protect the semiconductor light-emitting device 71 against ESD surges.

The third and fourth outer electrodes 53, 54 of the varistor 11 thus connected to the semiconductor light-emitting device 71 function as input/output terminal electrodes for the varistor 11. Similarly, the first and second outer electrodes 51, 52 function as pad electrodes electrically connected to the semiconductor light-emitting device 71.

In the light-emitting apparatus LE, the bump electrodes 78 of the semiconductor light-emitting device 71 are connected physically and thus thermally to the first and second outer electrodes 51, 52 of the varistor 11. The first outer electrode 51 is connected physically and thus thermally to the first inner electrodes 31 to 35. The second outer electrode 52 is connected physically and thus thermally to the second inner electrodes 41 to 45. Therefore, the heat generated in the semiconductor light-emitting device 71 is transmitted to the first and second inner electrodes 31 to 35, 41 to 45 through the bump electrodes 78 and first and second outer electrodes 51, 52.

In the light-emitting apparatus LE in accordance with this embodiment, the first and second outer electrodes 51, 52 physically connected to the semiconductor light-emitting device 71 are physically connected to their corresponding first and second inner electrodes 31 to 35, 41 to 45 as in the foregoing, whereby the heat generated in the semiconductor light-emitting device 71 is transmitted to the first and second inner electrodes 31 to 35, 41 to 45 through the first and second outer electrodes 51, 52. Meanwhile, the end portions 31a to 35a, 31b to 35b, 41a to 45a, 41b to 45b of the first and second inner electrodes 31 to 35, 41 to 45 are exposed at the main faces 22, 23 of the varistor element body 21. The end portions 31a to 35a, 31b to 35b, 41a to 45a, 41b to 45b have portions 31c to 35c, 31d to 35d, 41c to 45c, 41d to 45d exposed from the first and second outer electrodes 51 to 54. As a result, the heat generated in the semiconductor light-emitting device 71 can be efficiently be diffused from the varistor 11 (first and second inner electrodes 31 to 35, 41 to 45).

In this embodiment, the end portions 31a to 35a, 31b to 35b, 41a to 45a, 41b to 45b of the first and second inner electrodes 31 to 35, 41 to 45 are exposed at the opposing main faces 22, 23 of the varistor element body 21, and are connected electrically and physically to the first to fourth outer electrodes 51 to 54 formed on the main faces 22, 23. Therefore, the semiconductor light-emitting device 71 and varistor 11 can easily be connected in parallel through the first and second outer electrodes 51, 52 formed on the main face 22. Also, the varistor 11 can easily be mounted to a circuit board or the like by using the first and second outer electrodes 53, 54 formed on the main face 23.

Though preferred embodiments of the present invention are explained in the foregoing, the present invention is not necessarily restricted to the above-mentioned embodiments and can be modified in various ways within the scope not deviating from the gist thereof.

Though the embodiments illustrate a case where a semiconductor light-emitting device is used as an electronic device, this is not restrictive. The present invention is applicable to not only the semiconductor light-emitting devices, but also electronic devices (e.g., FET and bipolar transistors) which generate heat during their operations.

Though the varistor 11 comprises five each of the first inner electrodes 31 to 35 and second inner electrodes 41 to 45 in the embodiments, this is not restrictive. For example, the varistor 11 may comprise one each of the first inner electrode 31 and second inner electrode 41, or the first inner electrodes and second inner electrodes by numbers greater or smaller than those mentioned above.

Though a GaN-based semiconductor LED or a light-emitting diode of a ZnO-based semiconductor is used as the semiconductor light-emitting device 71 in the embodiments, this is not restrictive. For example, nitride-based semiconductor LEDs (e.g., InGaNAs-based semiconductor LED) other than those based on GaN, compound semiconductor LEDs other than those based on nitrides, and laser diodes (LD) may also be used as the semiconductor light-emitting device 71.

Though the varistor 11 comprises a pair of first and second outer electrodes 51, 52 and a pair of third and fourth outer electrodes 53, 54 in the embodiments, this is not restrictive. For example, it will be sufficient if the varistor 11 comprises one pair of outer electrodes selected from one pair of first and second outer electrodes 51, 52 and one pair of third and fourth outer electrodes 53, 54. In this case, one pair of outer electrodes function as an input/output terminal electrode and a pad electrode.

The first and third outer electrodes 51, 53 and the second inner electrodes 41 to 45 may partly overlap with each other when seen in a direction perpendicular to the main faces 22, 23 as long as electric insulation is secured between the first and third outer electrodes 51, 53 and the second inner electrodes 41 to 45. Similarly, the second and fourth outer electrodes 52, 54 and the first inner electrodes 31 to 35 may partly overlap with each other when seen in a direction perpendicular to the main faces 22, 23 as long as electric insulation is secured between the second and fourth outer electrodes 52, 54 and the first inner electrodes 31 to 35. The main faces 22, 23 may be covered with a material excellent in thermal transmission.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A varistor comprising:
   a varistor element body;
   first and second inner electrodes arranged within the varistor element body so as to oppose each other and have end portions exposed at two outer surfaces of the varistor element body;
   a first outer electrode arranged on one of the two outer surfaces so as to cover a portion of the end portion of the first inner electrode exposed at the one outer surface while being physically and electrically connected to the first inner electrode;
   a second outer electrode arranged on the one outer surface so as to cover a portion of the end portion of the second inner electrode exposed at the one outer surface while being physically and electrically connected to the second inner electrode; and
   an electrically insulating layer arranged on the one outer surface so as to cover a portion exposed from the first outer electrode in the end portion of the first inner electrode and a portion exposed from the second outer electrode in the end portion of the second inner electrode.

2. A varistor according to claim 1, wherein a plurality of first electrodes and a plurality of second electrodes are arranged alternately within the varistor element body;
   wherein the first outer electrode is arranged so as to extend over a plurality of the first inner electrodes and is connected thereto physically and electrically; and
   wherein the second outer electrode is arranged so as to extend over a plurality of the second inner electrodes and is connected thereto physically and electrically.

3. A varistor according to claim 1, further comprising:
   a third outer electrode arranged on the other of the two outer surfaces so as to cover a portion of the end portion of the first inner electrode exposed at the other outer surface while being physically and electrically connected to the first inner electrode;
   a fourth outer electrode arranged on the other of the two outer surfaces so as to cover a portion of the end portion of the second inner electrode exposed at the other outer surface while being physically and electrically connected to the second inner electrode; and
   an electrically insulating layer arranged on the other outer surface so as to cover a portion exposed from the third outer electrode in the end portion of the first inner electrode and a portion exposed from the fourth outer electrode in the end portion of the second inner electrode.

4. A varistor according to claim 3, wherein a plurality of first electrodes and a plurality of second electrodes are arranged alternately within the varistor element body;
   wherein the first and third outer electrodes are arranged so as to extend over a plurality of the first inner electrodes and are connected thereto physically and electrically; and
   wherein the second and fourth outer electrodes are arranged so as to extend over a plurality of the second inner electrodes and are connected thereto physically and electrically.

5. A varistor according to claim 1, wherein the two outer surfaces oppose each other.

6. A light-emitting apparatus comprising a semiconductor light-emitting device and a varistor, the varistor comprising:
   a varistor element body;
   first and second inner electrodes arranged within the varistor element body so as to oppose each other and have end portions exposed at two outer surfaces of the varistor element body;
   a first outer electrode arranged on one of the two outer surfaces so as to cover a portion of the end portion of the first inner electrode exposed at the one outer surface while being physically and electrically connected to the first inner electrode;
   a second outer electrode arranged on the one outer surface so as to cover a portion of the end portion of the second inner electrode exposed at the one outer surface while being physically and electrically connected to the second inner electrode; and
   an electrically insulating layer arranged on the one outer surface so as to cover a portion exposed from the first outer electrode in the end portion of the first inner electrode and a portion exposed from the second outer electrode in the end portion of the second inner electrode;
   wherein the semiconductor light-emitting device is connected to the first and second outer electrodes physically and electrically so as to be connected in parallel to the varistor.

* * * * *